(12) United States Patent
Kaneda (10) Patent No.: US 6,947,325 B2
(45) Date of Patent: Sep. 20, 2005

(54) NON-VOLATILE SEMICONDUCTOR MEMORY DEVICE AND CONTROLLING METHOD OF THE SAME

(75) Inventor: Yoshinobu Kaneda, Gunma (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/850,441

(22) Filed: May 21, 2004

(65) Prior Publication Data

US 2005/0002235 A1  Jan. 6, 2005

(30) Foreign Application Priority Data

May 27, 2003 (JP) ........................................ 2003-149357

(51) Int. Cl.[7] .............................. G11C 16/04; G11C 8/00
(52) U.S. Cl. .............................. 365/185.14; 365/230.06; 365/189.01
(58) Field of Search ..................... 365/185.14, 185.21, 365/189.01, 218, 230.06, 207

(56) References Cited

U.S. PATENT DOCUMENTS 5,748,534 A * 5/1998 Dunlap et al. .......... 365/185.21
6,285,589 B1 * 9/2001 Kajitani ................... 365/185.2

* cited by examiner

*Primary Examiner*—Thong Q. Le
(74) *Attorney, Agent, or Firm*—Morrison & Foesrster LLP (57) ABSTRACT

This invention largely reduces a data writing time of a non-volatile semiconductor memory device. A memory array is split into a first memory cell array to be programmed with normal data in its memory cells and a second memory cell array to be programmed with inverted data of the normal data in its memory cells. A column decoder selects a bit line connected with the memory cell written with the normal data and a bit line connected with the memory cell written with the inverted data simultaneously. A differential amplifier amplifies a difference between signals outputted to the pair of these bit lines and outputs it to an I/O line.

10 Claims, 6 Drawing Sheets

PRIOR ART

*FIG.7*

NON-VOLATILE SEMICONDUCTOR MEMORY DEVICE AND CONTROLLING METHOD OF THE SAME

CROSS-REFERENCE OF THE INVENTION

This invention is based on Japanese Patent Application No. 2003-149357, the content of which is incorporated by reference in its entirety.

BACKGROUND OF THE INVENTION

1. Field of the Invention

This invention relates to a non-volatile semiconductor memory device, particularly to an electrically erasable programmable ROM (EEPROM).

2. Description of the Related Art

In an EEPROM having memory cells each formed of a single transistor, the transistor has a double gate structure having a floating gate and a control gate.

In such a transistor having the double gate structure, writing of information is performed by accelerating hot electrons generated on a drain side of the floating gate toward a source side thereof, and injecting the hot electrons in the floating gate through the gate insulation film.

Reading of information is performed by detecting a difference between operating characteristics of memory cell transistors by judging whether or not a charge is injected into each of the floating gates.

Figure 6:
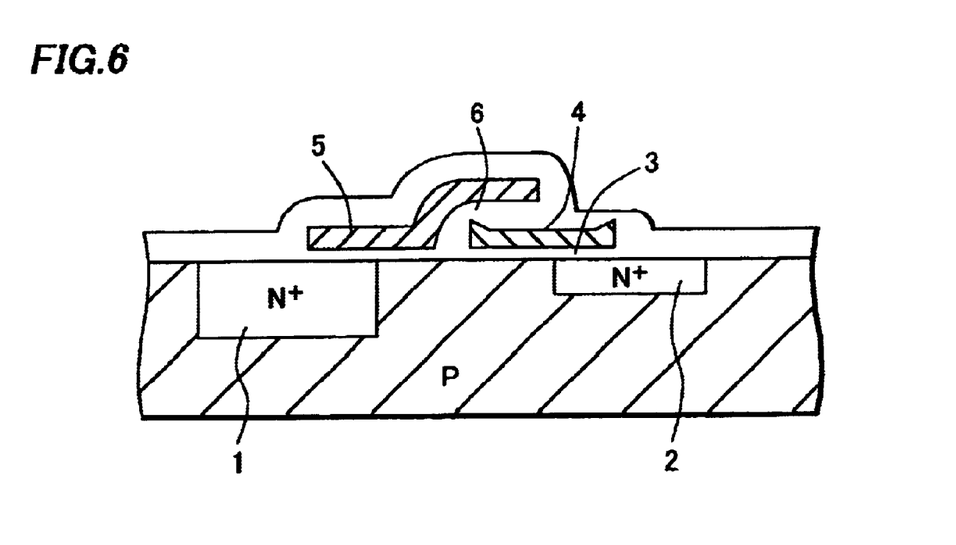
FIG. 6 is a cross-sectional view of a structure of a memory cell of split gate type.

There are two types of structures of such memory cells. One is a stacked gate type, and another is a split gate type. In memory cells of split gate type, as shown in FIG. 6, a floating gate 4 is formed above a channel formed between a drain 1 and a source 2 with an insulation film 3 interposed between the floating gate 4 itself and the channel and, partially overlapping the source 2. Furthermore, a control gate 5 is formed, partially overlapping the floating gate 4 with the insulation film 6 interposed therebetween.

Figure 7:
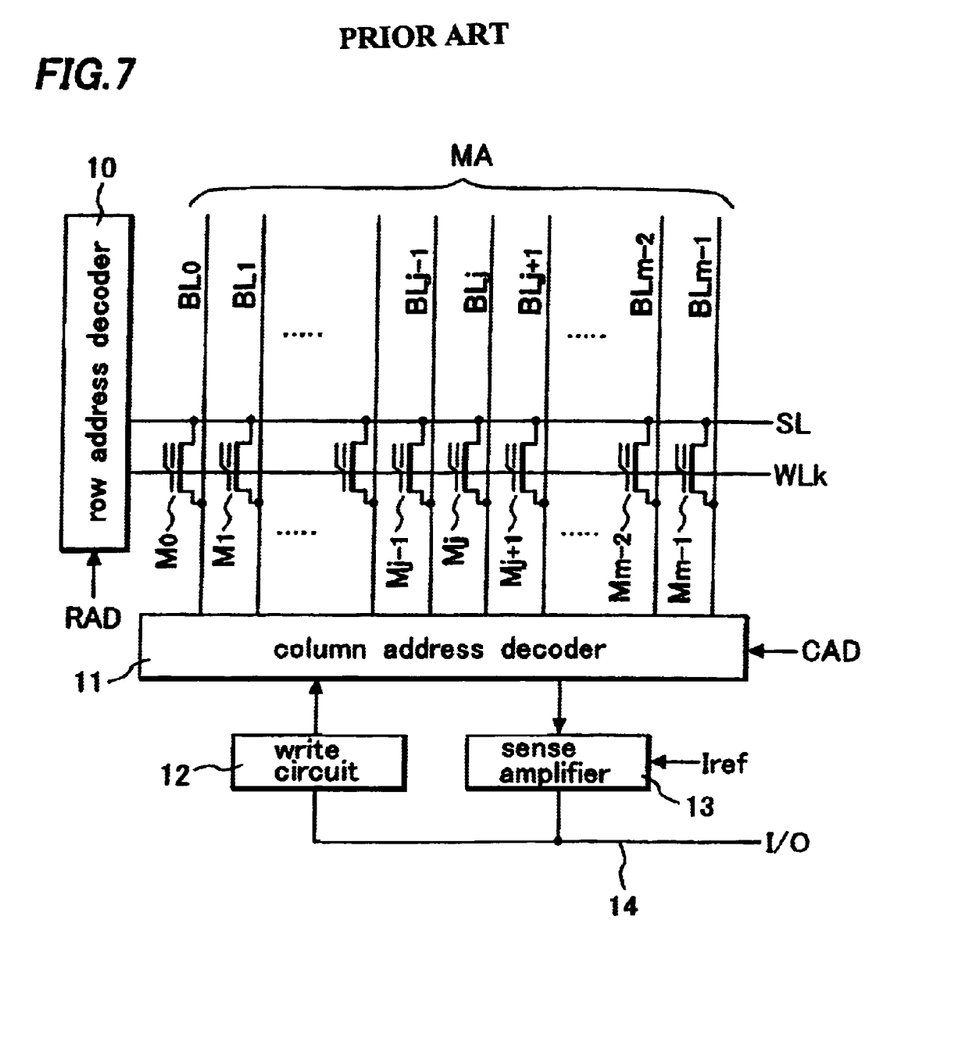
FIG. 7 is a circuit diagram showing a structure of a non-volatile semiconductor memory device of a conventional art.

A structure of a non-volatile semiconductor memory device using such memory cells of split gate type is briefly shown in FIG. 7. The memory cell array is formed of a plurality of memory cells disposed in a matrix of n rows and m columns.

Each of the memory cells is disposed in each of intersections between n number of word lines WL0 to Wn−1 and m number of bit lines BL0 to BLm−1. A control gate (indicated by numeral 5 in FIG. 6) of the memory cell in each of the rows is connected with one of the word lines WL0 to Wn−1, and a drain (indicated by numeral 1 in FIG. 6) thereof is connected with one of the bit lines BL0 to BLm−1.

A source (indicated by numeral 2 in FIG. 6) of the memory cell in each of the rows is connected with a common source line SL. Note that FIG. 7 shows only m pieces of memory cells M0 to Mm−1 connected with a word line WLk in a k-th row in the above-described memory cell array.

A row address decoder 10 supplies a voltage corresponding to a program mode, a read mode and an erase mode, to the common source line SL relating to a selected word line (e.g. word line WLk). A column address decoder 11 selects one (e.g. bit line BLj) of m number of the bit lines BL0 to BLm−1 in the program mode and the read mode.

A voltage controlled by a write circuit 12 is applied to the selected bit line BLj in the program mode, and the selected bit line BLj is connected to a sense amplifier 13 in the read mode.

Next, the erase, program and read operations of the above-described non-volatile semiconductor memory device will be described.

(1) Erase Operation

The column address decoder 11 applies ground potential (0V) to all the bit lines BL0 to BLm−1, and the row address decoder 10 applies an erase voltage (14.5 V) to all the word lines WL0 to Wn−1. Then, the erase voltage (e.g. 14.5 V) is applied to the control gates 5 of all the memory cells, and a voltage of 0V is applied to the drains 1 and the sources 2.

With respect to the memory cells M0 to Mm−1 connected with the word line WLk, capacitive coupling between the sources 2 and the floating gates 4 is larger than capacitive coupling between the control gates 5 and the floating gates 4 so that electric potential of the floating gates 4 is fixed at 0V, which is the same voltage as that of the sources 2, by the capacitive coupling with the sources 2. Then, a difference between electric potentials of the control gates 5 and the floating gates 4 becomes 14.5V so that a Fowler-Nordheim (F-N) tunnel current flows through a tunnel oxide film 6.

That is, electrons injected in the floating gates 4 are extracted from protruding portions of the floating gates 4 into the control gates 5. Batch erase of the memory cells M0 to Mm−1 connected with the word line WLk is thus performed.

(2) Program Operation (Write Operation)

The row address decoder 10 selects the word line WLk, for example, based on applied row address data RAD. Then, the row address decoder 10 applies a select voltage Vgp (e.g. 2.0V) to this word line WLk, and a ground voltage 0V to other non-selected word lines. Furthermore, the row address decoder 10 supplies a program voltage Vp (e.g. 12.2V) to the common source line SL corresponding to the selected word line WLk.

The column address decoder 11 connects the bit line BL (e.g. BLj) selected based on column address data CAD to the write circuit 12. Therefore, the selected bit line BLj is applied with a voltage based on the write data applied to an input and output terminal I/O line 14.

For example, when the input and output I/O line 14 is applied with data "0", the bit line BLj is applied with a write enable voltage Vse (e.g. 0.9V). When the input and output I/O line 14 is applied with data "1", the bit line BLj is applied with a write disable voltage Vsd (e.g. 4.0V). The other non-selected bit lines are applied with a write disable voltage Vsd (e.g. 4.0V).

Therefore, at a memory cell Mj specified by the word line WLk and the bit line BLj, when the input and output I/O line 14 is applied with data "0", the source 2 is applied with a voltage of 12.2V, the drain 1 is applied with a voltage of 0.9V, and the control gate 5 is applied with a voltage of 2.0V. This makes carrier flow from the drain 1 to the source 2. Here, the voltage of the floating gate 4 becomes approximately the same as that of the source 2 by capacitive coupling between the floating gate 4 and the source 2. Therefore, the carrier is injected into the floating gate 4 through the insulating film 3 as hot electrons.

On the other hand, when the input and output I/O line 14 is applied with data "1", the source 2 of the memory cell Mj is applied with a voltage of 12.2V, the drain 1 thereof is applied with a voltage of 4.0V, and the control gate 5 thereof is applied with a voltage of 2.0V. Therefore, the memory cell Mj turns off so that the carrier does not flow into the floating gate 4.

Furthermore, in the non-selected memory cells, too, the voltages applied to the drain 1, the source 2, and the control gate 5 do not satisfy program conditions so that the carrier is not injected to the floating gate 4.

(3) Read Operation

The row address decoder 10 applies a select voltage Vgr (e.g. 4.0V) to the word line WL (e.g. word line WLk) selected based on the row address data RAD, and applies a ground voltage (0V) to all the common source line SL. On the other hand, the column address decoder 11 connects the bit line BL (e.g. bit line BLj) selected based on the column address data CAD to the sense amplifier 13.

Reading of data stored in the memory cell Mj specified by the word line WLk and the bit line BLj is performed. At this time, the sense amplifier 13 performs judgment of the read data based on quantitative relation between a reference current Iref of a predetermined amount and a cell current Ir flowing in the memory cell Mj. That is, the sense amplifier 13 judges the data to be "1" when the cell current Ir is larger than the reference current Iref, or judges the data to be "0" when the cell current Ir is smaller than the reference current Iref.

However, the cell current Ir in the read mode varies by various factors such as time passing or disturbance during programming. For example, when data in a certain memory cell Mj is "1" (i.e., in a state where the floating gate 4 is not injected with carrier), the carrier enters the floating gate 4 from a substrate with time so that the cell current Ir reduces.

The reference current Iref is a constant current. Therefore, when the cell current Ir becomes lower than the reference current Iref, the data "1" changes into the data "0". Thus, data retention characteristics deteriorates.

Furthermore, the above-described non-volatile semiconductor memory device has a problem that it requires a long time to rewrite the data. For example, when data "1" programmed in a certain memory cell Mj is to be changed into data "0", the above-described program operation is performed. This operation can be performed with relatively short time (several $\mu$ sec) since a method of injecting hot electrons into the floating gate 4 through the insulation film 3 is employed. On the other hand, when data "0" programmed in a certain memory cell Mj is to be changed into data "1," the erase operation is performed. However, this operation takes as long as several m sec by employing a conventional method of extracting electrons injected in the floating gate 4 into the control gate 5 by flowing a F-N tunnel current.

SUMMARY OF THE INVENTION

The invention provides a non-volatile semiconductor memory device that includes a plurality of bit lines, a plurality of word lines, a plurality of non-volatile memory cells, a row address decoder selecting a word line from the plurality of the word lines, a column address decoder simultaneously selecting a pair of bit lines from the plurality of the bit lines, and a differential amplifier amplifying a difference between signals outputted from a pair of non-volatile memory cells that are connected to the selected pair of the bit lines.

The invention also provides a method for controlling a non-volatile semiconductor memory device that includes a plurality of bit lines, a plurality of non-volatile memory cells, and an address decoder simultaneously selecting a pair of bit lines from the plurality of the bit lines. The method includes erasing data stored in the plurality of the non-volatile memory cells, writing data to one of a pair of the non-volatile memory cells that are connected to the selected pair of the bit lines respectively, and amplifying a difference between signals outputted form the pair of non-volatile memory cells.

DETAILED DESCRIPTION OF THE INVENTION

Figure 1:
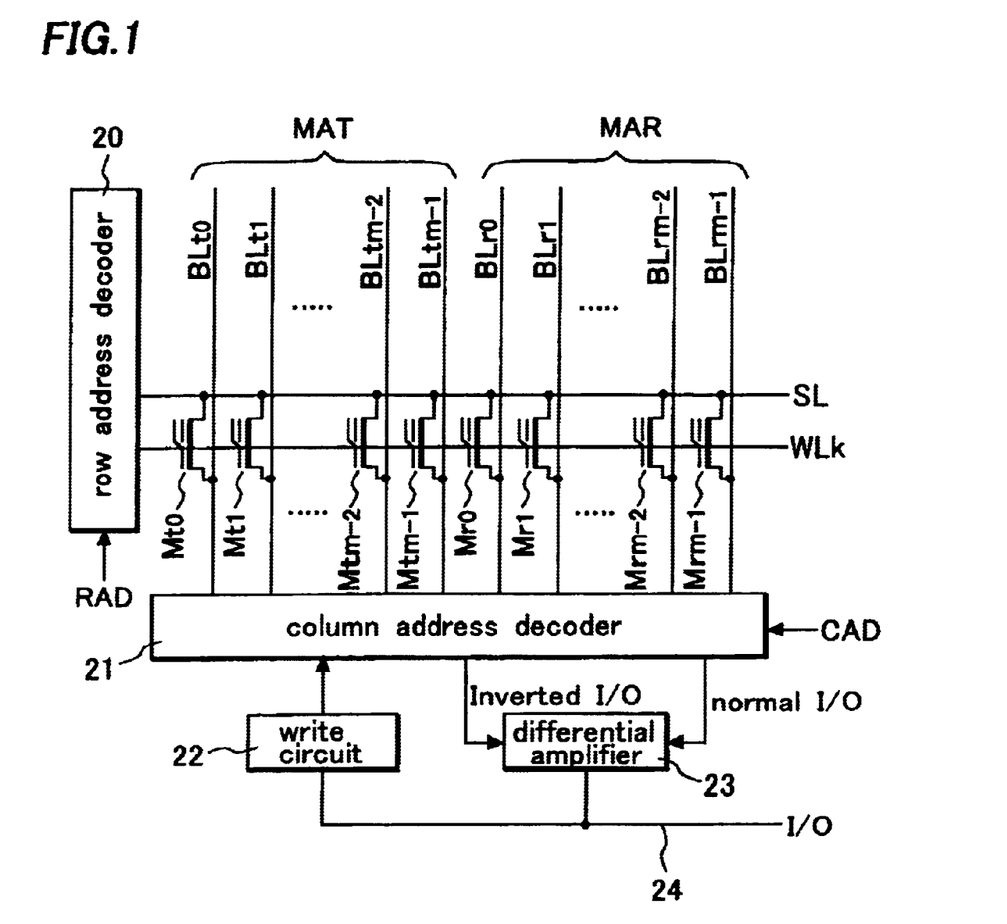
FIG. 1 is a circuit diagram showing a structure of a non-volatile semiconductor memory device of an embodiment of the invention.

Next, a non-volatile semiconductor memory device of an embodiment of the invention will be described with reference to drawings in detail. FIG. 1 is a circuit diagram showing a structure of the non-volatile semiconductor memory device using memory cells of a split gate type. Note that the memory cells shown in FIG. 1 have the same structure as the memory cell shown in FIG. 6.

A plurality of memory cells is disposed in a matrix of rows and columns to form a memory cell array. The memory cell array is split into a first memory cell array MAT to be programmed with normal data in its memory cells and a second memory cell array MAR to be programmed with inverted data of the normal data in its memory cells.

In the first memory cell array MAT, each of the memory cells is disposed in each of intersections between n number of word lines WL0 to WLn−1 and m number of bit lines BLt0 to BLtm−1. A control gate (indicated by numeral 5 in FIG. 6) of the memory cell in each of the rows is connected with one of n number of the word lines WL0 to WLn−1, and a drain of the memory cell (indicated by numeral 1 in FIG. 6) is connected with one of m number of the bit lines BLt0 to BLtm−1. A source (indicated by numeral 2 in FIG. 6) of the memory cell in each of the rows is connected with a common source line SL.

In the second memory cell array MAR, each of the memory cells is disposed in each of intersections between n number of the word lines WL0 to WLn−1 and m number of bit lines BLr0 to BLrm−1, a control gate (indicated by numeral 5 in FIG. 6) of the memory cell in each of the rows is connected with one of n number of the word lines WL0 to WLn−1, and a drain (indicated by numeral 1 in FIG. 6) of the memory cell is connected with one of m number of the bit lines BLr0 to BLrm−1. A source (indicated by numeral 2 in FIG. 6) of the memory cell in each of the rows is connected with the common source line SL.

FIG. 1 only shows m number of memory cells Mt0 to Mtm−1 connected with a word line WLk in a k-th row in the first memory cell array MAT, and m number of memory cells Mr0 to Mrm−1 connected with the word line WLk in the k-th row in the second memory cell array MAR.

A row address decoder 20 supplies a voltage according to a program mode, a read mode and an erase mode to the common source line SL relating to a selected word line WL (e.g. word line WLk). A column address decoder 21 selects one (e.g. BLtj) of m number of the bit lines BLt0 to BLtm−1 in the first memory cell array MAT, and one (e.g. BLrj) of m number of the bit lines BLr0 to BLrm−1 in the second memory cell array MAT, in the program mode and the read mode.

In the program mode, a voltage controlled by a write circuit 22 is applied to the pair of the bit lines BLtj and BLrj selected by the column address decoder 21, and data "0" is programmed only to one of the memory cells connected to the pair of the bit lines BLtj and BLrj. For example, a memory cell Mtj connected with the bit line BLtj is programmed with the data Here, the bit line BLtj is a bit line selected from the first memory cell array MAT, and the bit line BLrj is a bit line selected from the second memory cell array MAR. At this time, the memory cell Mrj is written with data "1" by an erase operation performed in advance. The column address decoder 21 can be configured so as to select any one of the pair of the bit lines BLtj and BLrj, which is to be written with the data "0".

In the read mode, the pair of the bit lines BLtj and BLrj selected by the column address decoder 21 is respectively connected with a pair of differential input terminals of the differential amplifier 23 through a normal I/O (input and output) line and an inverted I/O line. Then, a differential amplifier 23 amplifies a difference between signals according to normal data (e.g. data "0") and inverted data (e.g. data "1") respectively written in the pair of the memory cells Mtj and Mrj, and the data "0" or "1" is outputted to an I/O line 24.

Figure 2:
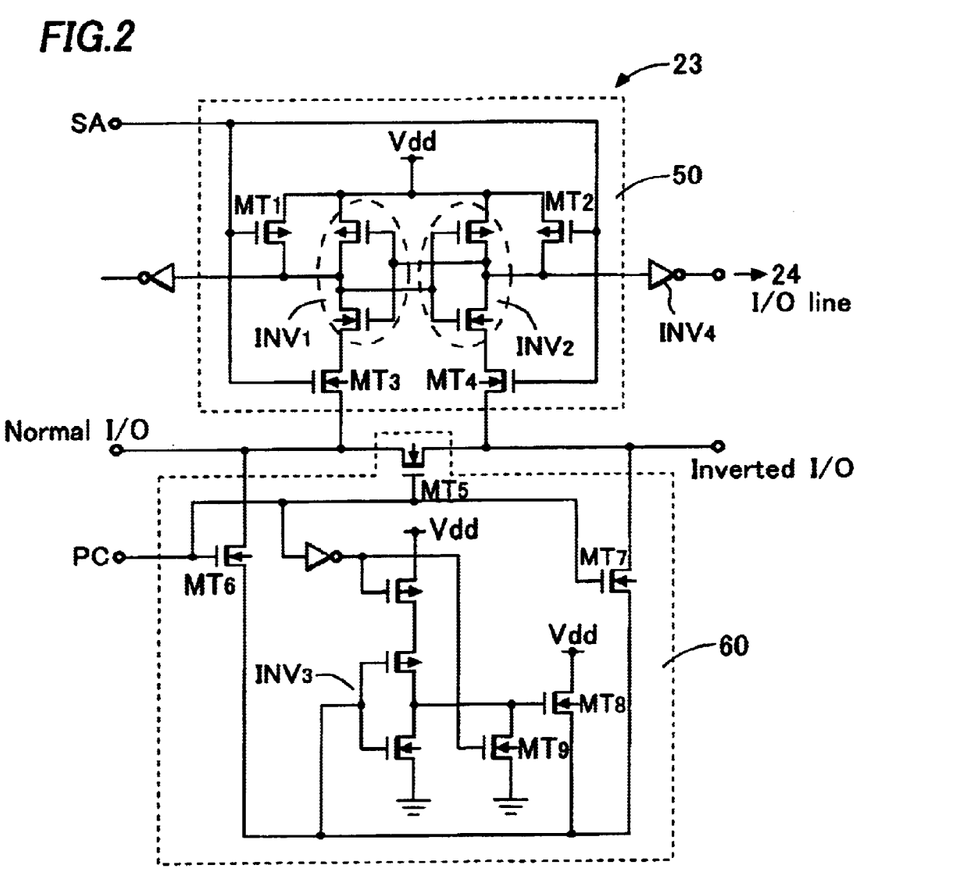
FIG. 2 is a circuit diagram showing a structure of a differential amplifier of FIG. 1 as an example.

FIG. 2 is a circuit diagram showing a structure of the differential amplifier 23 as an example. This differential amplifier 23 includes a differential amplifier portion 50 and a pre-charge circuit portion 60. In the differential amplifier portion 50, a sense amplifier activation signal SA is applied to gates of MOS transistors MT1, MT2, MT3, and MT4. The MT1 and the MT2 are of P-channel type, and the MT3 and the MT4 are of N-channel type.

An output of an inverter INV1 is connected with an input of an inverter INV2 and an output of the inverter INV2 is connected with an input of the inverter INV2 so that the inverters INV1 and INV2 operate as an amplifier. When the sense amplifier activation signal SA becomes high, the MT1 and the MT2 turn off and the MT3 and the MT 4 turn on so that the inverters INV1 and INV2 are connected with the normal I/O line and the inverted I/O line through the MT3 and the MT4, respectively.

In the pre-charge circuit portion 60, a pre-charge signal PC is applied to gates of MOS transistors MT5, MT6, and MT7. MT5, the MT6 and the MT7 are of N-channel type. When the pre-charge signal becomes high, the MT5, the MT6, and the MT7 turn on, so that the inverter INV3 and the MOS transistor MT8 of N-channel type operate, and the normal I/O line and the inverted I/O line are pre-charged to potential of about ½ Vdd. The Vdd is a power supply voltage.

When the pre-charge signal becomes low, the inverter INV3 is cut off from a power supply, and when the MOS transistor MT9 of N-channel type turns on, the MT8 turns off, thereby stopping pre-charging.

Figure 3:
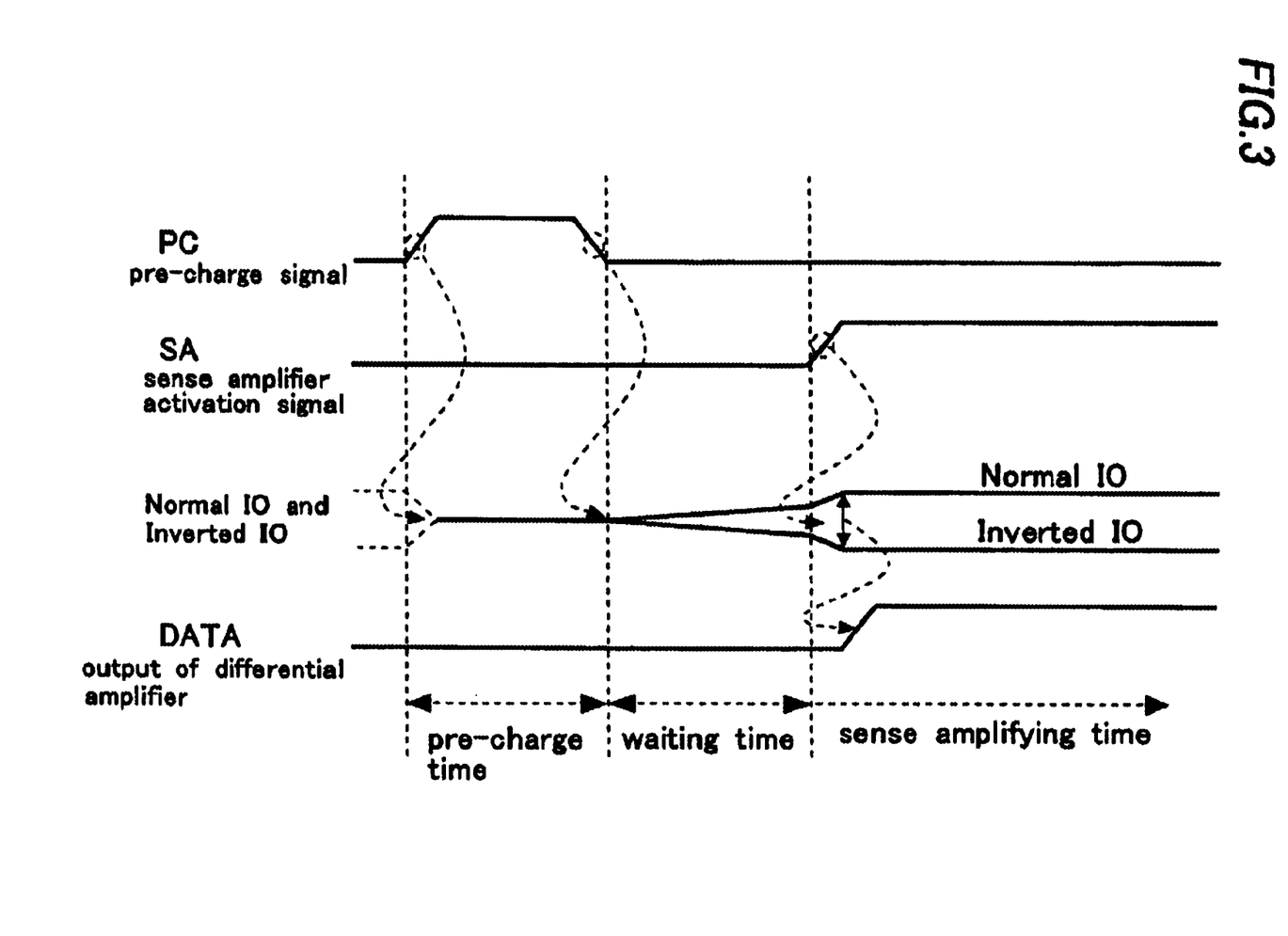
FIG. 3 is an operation timing chart for explaining a read operation of the non-volatile semiconductor memory device of the embodiment of the invention.

Next, a read operation using this differential amplifier 23 will be described with reference to an operation timing chart of FIG. 3. First, in a pre-charge time, when the pre-charge signal PC becomes high, the normal I/O line and the inverted I/O line are pre-charged to potential of about ½ Vdd. When the pre-charge signal PC becomes low, pre-charging stops.

The row address decoder 20 applies a select voltage Vgr (e.g. 4.0V) to the word line WL (e.g. word line WLk) selected based on the row address data RAD, and applies a ground voltage (0V) to all the common source lines SL. The column address decoder 21 connects the pair of the bit lines BL (e.g. bit lines BLtj and BLrj) selected based on the column address data CAD to the differential amplifier 23 through the normal I/O line and the inverted I/O line.

Signals from the pair of the memory cells Mtj and Mrj respectively connected with the pair of the bit lines BLtj and BLrj are outputted to the normal I/O line and the inverted I/O line. For example, when the memory cell Mtj is written with data "1" and the memory cell Mrj is written with data "0", a cell current Irt(j) flowing in the memory cell Mtj becomes larger than a cell current Irb(j) flowing in the memory cell Mrj (Irt(j)>Irb(j)). Then, this difference between the currents makes a potential difference between the normal I/O line and the inverted I/O line gradually increase (for a waiting time shown in FIG. 3).

Then, when the sense amplifier activation signal SA becomes high, the differential amplifier portion 50 is activated, rapidly increasing the potential difference between the normal I/O line and the inverted I/O line. Then, the output from the differential amplifier 23 is outputted to the I/O line 24 through the inverter INV4.

Figure 4:
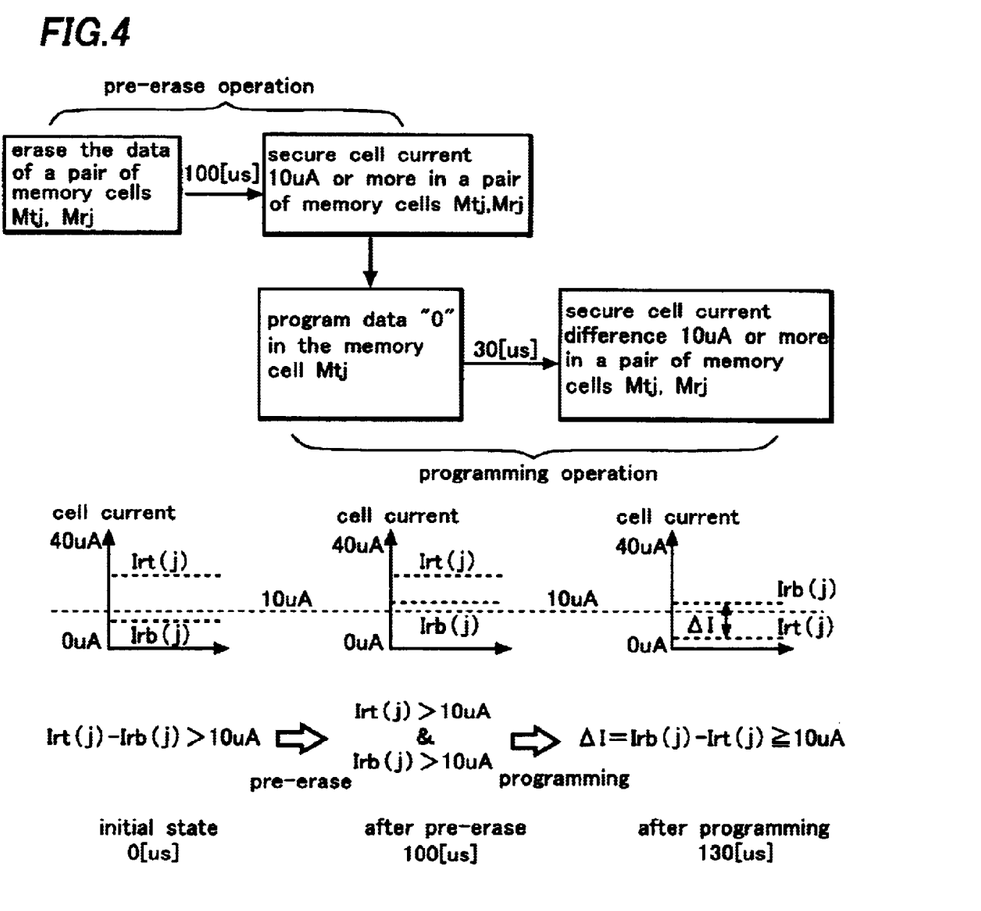
FIG. 4 is a diagram for explaining an example of a data rewriting method of the non-volatile semiconductor memory device of the embodiment of the invention.

Next, an example of a data rewriting method of the above-described non-volatile semiconductor memory device will be described with reference to FIG. 4. In an initial state, the memory cell Mtj is written with data "1" as normal data, and the corresponding memory cell Mrj is written with data "0" which is inverted data of the data "0".

Rewriting of the memory cell Mtj into the data "0" and the memory cell Mrj into the data "1" from the above state will be described.

First, a pre-erase operation is performed to the pair of the memory cells Mrj and Mtj written with the normal data and the inverted data of the normal data respectively. This erase operation is the same as that of the described conventional art.

That is, the column address decoder 20 applies a ground voltage (0V) to all the bit lines BLt0 to BLtm of the first memory cell array MAT and all the bit lines BLr0 to BLrm of the second memory cell array MAR. The row address decoder 20 applies an erase voltage (14.5 V) to all the word lines WL0 to WLn. Then, the control gates 5 of all the memory cells are applied with the erase voltage (14.5 V), and the drains 1 and the sources 2 are applied with the ground voltage of 0V.

With respect to the memory cells Mt0 to Mtm−1 and the memory cells Mr0 to Mrm−1 connected with the word line WLk, capacitive coupling between the sources 2 and the floating gates 4 is much larger than capacitive coupling between the control gates 5 and the floating gates 4. Therefore, the potential of the floating gates 4 at this time is fixed at 0V, which is the same potential as that of the sources 2, by capacitive coupling with the sources 2, and the potential difference between the control gates 5 and the floating gates 4 becomes 14.5 V, so that the Fowler-Nordheim tunnel current flows through the tunnel oxide film 6. Accordingly, data of all the memory cells are erased. That is, all the memory cells are written with the data "1".

In this embodiment, however, the above-described erase operation is performed only for a time that is sufficient for the cell current Irb (j) of the memory cell Mrj written with the data "0" to exceed a predetermined current (e.g. 10 μA). The time is only 100 μsec, which is extremely shorter than a time for erasing all (several m sec).

Then, the program operation is performed only to the memory cell Mtj to be programmed with the data "0". This operation is the same as that described above. The program operation is stopped at the time when a differential current ΔI=Irb(j)−Irt(j) between the cell currents of the memory cells Mrj and Mtj becomes a predetermined value (e.g. 10 μA).

The potential difference between the normal I/O line and the inverted I/O line, which occurs according to a difference between cell currents ΔI of the memory cells Mrj and Mtj, is amplified by the above-described differential amplifier 23. This programming takes about 30 μsec only. Therefore, the rewriting totally takes 130 μsec only, which is largely shorter than a conventional rewriting time.

This embodiment thus employs the method of reading and judging the data based on the differential current ΔI of the cell currents between the pair of the memory cells Mrj and Mtj written with the normal data and the inverted data, which requires a differential current ΔI only by an amount such that the differential amplifier 23 does not malfunction. This largely reduces a data writing time.

This data writing time of the embodiment will be described as follows, concretely compared with the conventional art. In the conventional art, when a reference current Iref of the sense amplifier 13 is set at 30 μA and a judging margin of the sense amplifier 13 is set at 10 μA, a cell current Ir of 40 μA is needed for writing the data "1" in the memory cell.

Figure 5:
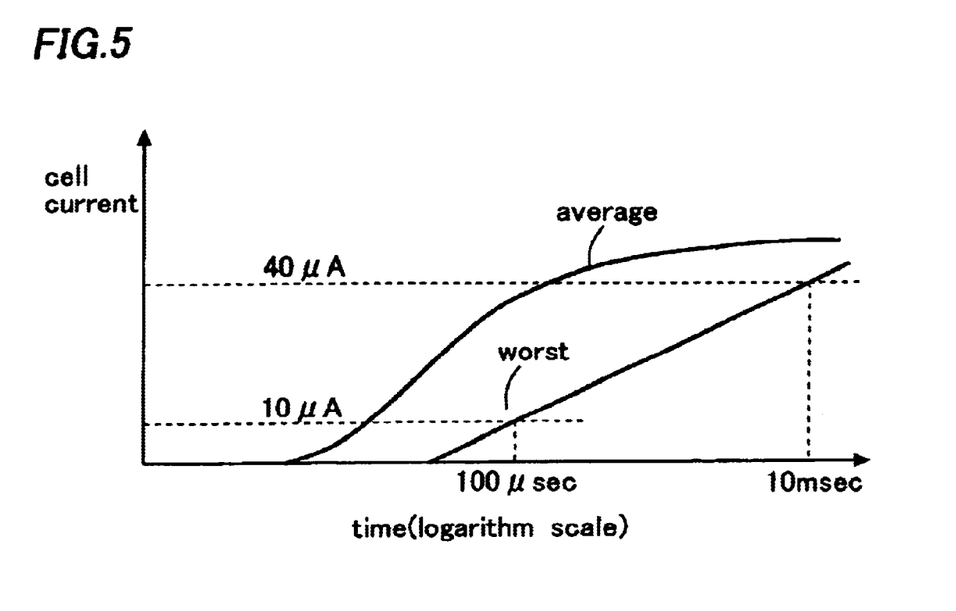
FIG. 5 is a diagram showing erase characteristics of a memory cell.

Therefore, as shown in FIG. 5, in the worst case a memory cell requires about 10 m sec as an erasing time (data "1" writing time). On the other hand, this embodiment needs only 130 μsec to secure the judging margin 10 μA of the differential amplifier 23, which is the same margin as that of the conventional art. This enables the writing or rewriting of data a thousand times faster than the conventional art.

In addition, when the writing time is set the same as that of the conventional art (about 10 m sec), the judging margin of the sense amplifier 13 in the conventional art for the data "0" and "1" is secured by only 10 to 20 μA.

On the other hand, in this embodiment, when a writing time is set the same as that of the conventional art (about 10 msec), the judging margin of the differential amplifier 23 is secured by 40 μA or more. This broad margin can largely improve data retention characteristics, disturbance characteristics and endurance characteristics.

Furthermore, the memory cell Mtj written with the normal data and the memory cell Mrj written with the inverted data of the normal data are arranged facing in a same direction in the memory cell array and have transistors of the same size so that those have same characteristics. Therefore, the cell current Irt(j) and Irb(j) similarly varies by various factors such as time passing or disturbance when programming.

For example, when the cell current of the memory cell Mtj increases by ΔIx to become Irt(j)+ΔIx, the cell current of the memory cell Mrj becomes Irb(j)+ΔIx. Accordingly, a difference between cell currents of the memory cells Mtj and Mrj is the same at any time. In this embodiment, a potential difference according to this differential current Irt(j)−Irb(j) is amplified by the differential amplifier 23 so that malfunction caused by potential variation caused by variation of the cell currents Irt(j) and Irb(j) can be prevented.

In this embodiment, the non-volatile semiconductor memory device having the memory cells of split gate type and electrically erasable is described as an example. However, the invention is not limited to this, but can be applied to a non-volatile semiconductor memory device having memory cells of other type, e.g., stacked gate type and electrically erasable.

In this embodiment, the whole memory cell array is split into two memory regions of the first memory cell array MAT and the second memory cell array MAR, and signals from a pair of memory cells respectively selected from the memory cell arrays MAT and MAR are differentially amplified. However, in the invention, a part of the whole memory cell array can be set as a high reliability memory region. This high reliability memory region is split into two memory regions of the first memory cell array MAT and the second memory cell array MAR, and other part of the memory cell array can have the same structure as the conventional art.

This high reliability memory region is written and stored with important data, destruction or a reading error of which makes the non-volatile semiconductor memory device fail to function as a device, for example, ID data or unique data of devices. This enables reading of such important data without fail, thereby increasing reliability of the non-volatile semiconductor memory device.

What is claimed is:

1. A non-volatile semiconductor memory device comprising:
   a plurality of bit lines;
   a plurality of word lines;
   a plurality of non-volatile memory cells;
   a row address decoder selecting a word line from the plurality of the word lines;
   a column address decoder simultaneously selecting a pair of bit lines from the plurality of the bit lines so that the selected word line and the selected pair of bit lines always identify a pair of a non-volatile memory cell that stores normal data and another non-volatile memory cell that stores inverted data; and
   a differential amplifier amplifying a difference between signals outputted from the pair of non-volatile memory cells that are connected to the selected pair of the bit lines.

2. The non-volatile semiconductor memory device of claim 1, further comprising a write circuit writing the normal data in one of the pair of the non-volatile memory cells and the inverted data that is an inversion of the normal data in another of the pair.

3. The non-volatile semiconductor memory device of claim 1, wherein the non-volatile memory cell is a non-volatile memory cell of a split gate type.

4. The non-volatile semiconductor memory device of claim 2, wherein the non-volatile memory cell is a non-volatile memory cell of a split gate type.

5. A non-volatile semiconductor memory device comprising:
   a first memory cell array comprising a plurality of first non-volatile memory cells each provided for one of intersections between a plurality of first bit lines and a plurality of word lines;
   a second memory cell array comprising a plurality of second non-volatile memory cells each provided for one of intersections between a plurality of second bit lines and the plurality of word lines;
   a row address decoder selecting a word line from the plurality of the word lines;
   a column address decoder simultaneously selecting a first bit line from the plurality of the first bit lines and a second bit line from the plurality of the second bit lines so that the selected word line and the selected first and second bit lines always identify a pair of a first non-volatile memory cell and a second non-volatile memory cell, one of the pair storing normal data and another of the pair storing inverted data;

a differential amplifier amplifying a difference between a signal outputted from the first non-volatile memory cell connected to the selected first bit line and another signal outputted from the second non-volatile memory cell connected to the selected second bit line.

6. The non-volatile semiconductor memory device of claim 5, further comprising a write circuit writing the normal data in one of the first non-volatile memory cell connected to the selected first bit line and the second non-volatile memory cell connected to the selected second bit line and wiring the inverted data that is an inversion of the normal data in another of the first non-volatile memory cell connected to the selected first bit line and the second non-volatile memory cell connected to the selected second bit line.

7. The non-volatile semiconductor memory device of claim 5, wherein the first and second non-volatile memory cells are non-volatile memory cells of a split gate type.

8. The non-volatile semiconductor memory device of claim 6, wherein the first and second non-volatile memory cells are non-volatile memory cells of a split gate type.

9. A method for controlling a non-volatile semiconductor memory device comprising a plurality of bit lines, a plurality of non-volatile memory cells, and an address decoder simultaneously selecting a pair of bit lines from the plurality of the bit lines, the method comprising:

erasing data stored in the plurality of the non-volatile memory cells;

selecting a pair of the non-volatile memory cells by selecting a pair of bit lines;

writing data to one of the selected pair of the non-volatile memory cells and leaving another of the selected pair of the non-volatile memory cells without the data; and amplifying a difference between signals outputted form the pair of non-volatile memory cells.

10. The method for controlling the non-volatile semiconductor memory device of claim 9, wherein the amplifying the difference is performed for a period that is required for a difference between cell currents flowing in the pair of the non-volatile memory cells to reach a predetermined value.

* * * * *